United States Patent
Goat

(10) Patent No.: US 7,353,585 B2
(45) Date of Patent: Apr. 8, 2008

(54) METHOD OF POLING FERROELECTRIC MATERIALS

(75) Inventor: Christopher Andrew Goat, West Malling (GB)

(73) Assignee: Delphi Technologies, Inc., Troy, MI (US)

( * ) Notice: Subject to any disclaimer, the term of this patent is extended or adjusted under 35 U.S.C. 154(b) by 182 days.

(21) Appl. No.: 10/517,624

(22) PCT Filed: Jun. 6, 2003

(86) PCT No.: PCT/GB03/02461

§ 371 (c)(1),
(2), (4) Date: Jul. 8, 2005

(87) PCT Pub. No.: WO03/105247

PCT Pub. Date: Dec. 18, 2003

(65) Prior Publication Data

US 2006/0042060 A1    Mar. 2, 2006

(30) Foreign Application Priority Data

Jun. 6, 2002    (GB) ................... 0213006.0

(51) Int. Cl.
*H04R 31/00* (2006.01)
(52) U.S. Cl. .................... 29/594; 29/25.35; 29/417; 29/609.1; 156/89.11; 156/89.12; 310/316.01; 310/357; 310/359; 381/173; 381/174; 381/175; 381/396
(58) Field of Classification Search ............... 29/25.35, 29/25.42, 417, 592.1, 594, 609.1, 890.1; 310/316.01, 357, 359; 381/173–175, 396; 156/89.11, 89.12, 250
See application file for complete search history.

(56) References Cited

U.S. PATENT DOCUMENTS

| | | | | |
|---|---|---|---|---|
| 4,564,782 A | * | 1/1986 | Ogawa | 310/359 |
| 4,625,137 A | * | 11/1986 | Tomono | 310/317 |
| 4,649,313 A | | 3/1987 | Ogawa et al. | |
| 5,758,396 A | | 6/1998 | Jeon et al. | |
| 6,046,526 A | * | 4/2000 | Maruyama | 310/323.06 |
| 6,356,008 B1 | | 3/2002 | Nakajima | |
| 6,806,626 B2 | * | 10/2004 | Morinaga et al. | 310/366 |

FOREIGN PATENT DOCUMENTS

| | | | | |
|---|---|---|---|---|
| JP | 06-216427 | | 5/1994 | |
| JP | 11219870 A | * | 8/1999 | |
| JP | 2000-133852 | | 12/2000 | |
| JP | 2001-513269 | | 8/2001 | |
| JP | 2002232032 | | 8/2002 | |

* cited by examiner

*Primary Examiner*—Paul D. Kim
(74) *Attorney, Agent, or Firm*—David P. Wood

(57) ABSTRACT

A method of producing an actuator includes shaping a block of ferroelectric material to provide an active element of the actuator. The element includes a stack of ferroelectric layers with adjacent layers separated by electrodes arranged parallel to end faces of the element. The method includes applying a primary electrode to the end faces, immersing the element and the primary electrode within a dielectric fluid, applying a primary poling voltage to the primary electrode so as to polarize the element in a first polarization direction, applying a secondary external electrode to side faces of the element, and applying a secondary poling voltage to the secondary electrode to polarize alternate layers along the first polarization direction and the other layers along a second, oppositely-directed polarization axis. The method may also include applying a conductive film to the end faces and/or applying heat to help evaporate the dielectric fluid.

11 Claims, 4 Drawing Sheets

METHOD OF POLING FERROELECTRIC MATERIALS

CROSS-REFERENCE TO RELATED APPLICATIONS

This application claims benefit of priority from PCT application number PCT/GB03/02461, which was filed Jun. 6, 2003; and GB patent application number 0213006.0, which was filed Jun. 6, 2002.

STATEMENT REGARDING FEDERALLY SPONSORED RESEARCH OR DEVELOPMENT

Not Applicable

THE NAMES OF PARTIES TO A JOINT RESEARCH AGREEMENT

Not Applicable

INCORPORATION-BY-REFERENCE OF MATERIAL SUBMITTED ON A COMPACT DISK

Not Applicable

BACKGROUND OF THE INVENTION (1) Field of the Invention

The invention relates to a method of producing an actuator of the type suitable for use in a fuel injection system for internal combustion engines. The method involves poling a ferroelectric sample so as to induce bulk piezoelectricity, and then implementing the sample in the actuator.

(2) Description of Related Art

In a piezoelectric crystal, mechanical strain or force is generated when an electric field is applied across opposite faces of the crystal. When the applied field is removed, the crystal structure will return to its original shape. Inorganic materials are only naturally piezoelectric in their single crystal form, whereas in a polycrystalline sample the individual crystallites are usually randomly oriented following manufacture. Although the crystallites individually exhibit piezoelectric coupling, the lack of overall preferred orientation means a piezoelectric effect is not apparent in the bulk material. Before such polycrystalline samples can be used in the manufacture of actuators, for example, it is therefore necessary to pole the material to align the dipoles, so as to give a crystal lattice structure with a preferred axis and direction.

In a ferroelectric crystal, permanent crystallographic reorientation can be induced by applying a sufficiently large electric field across opposite faces of the crystal (i.e. poling the crystal). Ferroelectric poling is illustrated in FIG. 1, which shows electric dipole moments 10 in a ferroelectric polycrystalline sample 12 (a) before poling (b) during poling and (c) after poling. The minimum electric field strength necessary to cause permanent crystallographic realignment, and dipole reorientation, is referred to as the "coercive" field strength. Once the coercive field strength is exceeded, the ferroelectric dipoles 10 become aligned (FIG. 1(c)). The permanent crystallographic reorientation that takes place during poling causes a small but significant change in sample shape, comprising an elongation along the field axis and a constriction normal to it. This is referred to as "ferroelectric strain". After the aforementioned crystallographic reorientation takes place, the material will exhibit bulk piezoelectricity. In the poled state, the application of a further applied field will induce a shape change, known as piezoelectric strain, (as described previously). This lasts only whilst the electric field is applied.

Referring to FIG. 2, if the further electric field applied to the ferroelectric sample 12 is of the same polarity as the poling field, the piezoelectric material dipole 10a is extended along the poling axis. In such circumstances the piezoelectric material extends along the field axis and constricts normal to the field axis (see FIG. 2(a)). If the further electric applied field is of opposite polarity to the poling field, the piezoelectric dipole 10b is caused to contract along the poling axis. In such circumstances the piezoelectric material constricts along the field axis and dilates normal to the field axis (see FIG. 2(b)).

The inducement of piezoelectric strain is utilized in piezoelectric actuators, such as those used in fuel injection systems. Such actuators typically include a stack of piezoelectric elements across which an electric field is applied to cause contraction or extension of the piezoelectric sample, in use. Extension (or contraction) of the stack is used to apply an actuation force directly or indirectly to a mechanical component, for example a valve element, for the purpose of controlling fuel injection. An injector of the aforementioned type is described in our co-pending patent application EP 0995 901 A1.

If ferroelectric samples of significant thickness are to be poled, relatively high poling voltages are required. Poling such materials requires voltages of the order of 1-2 kV/mm, and so even a sample having a thickness of just 1 centimeter requires application of between 10 and 20 kV.

Similar field strengths are also often required with piezoelectric samples to produce the levels of extension and contraction required in fuel injection system actuators. Such high voltages require expensive supply electronics, and it is undesirable to use such high voltages in a vehicle.

Multilayer ferroelectric samples with bulk piezoelectricity have been developed in order to reduce the poling voltages required. As shown in FIG. 3, a multilayer structure 14 is formed from a plurality of relatively thin piezoelectric layers 16, each of which is spaced from its adjacent layers by an internal electrode of a group of internal electrodes, 18a or 18b.

Alternate ones of the internal electrodes are grouped together to form the two sets of electrodes 18a, 18b such that the electrodes of one set 18a are interdigitated with the electrodes of the other set 18b. The internal electrodes of each set are connected together by means of first and second external electrodes 20a, 20b. By creating such a multilayer structure, for example having an electrode spacing of around 100 microns, an electric field of around 2 kV/mm can be achieved from an applied voltage of 200V. Due to the alternating polarity of the internal electric field, the poling direction in the piezoelectric multilayer alternates throughout the structure, as shown in FIG. 4.

Although the use of multilayer structures enables reduced poling voltages to be used, problems exist with the electrode designs which achieve this. Firstly, the two interdigitated sets 18a, 18b of internal electrodes must be isolated from each other to prevent short-circuiting, and to enable an electric field to be applied across the intervening material. Isolation of the interdigitated electrodes is usually achieved by terminating the electrode layers short of the opposite polarity external electrode (i.e. internal electrodes 18a terminate short of the external electrode 20b, and vice versa). However, referring to FIG. 5, a ferroelectric can only be poled where it is exposed to the coercive electric field and incomplete internal electrode layers therefore create regions 22 (shown hatched) of unpoled material adjacent to the external electrodes 20a, 20b. This gives rise to a ferroelectric strain discontinuity between the regions of poled and unpoled material, placing the unpoled material in tension and the poled material in compression. As a result, the poled material has a tendency to fracture and the unpoled material tends to clamp the adjacent poled material, thereby causing the multilayer structure to distort.

Secondly, in order to avoid undesirable "surface flashover" effects, which arise if the internal electrodes 18a, 18b meet the free surface of the sample, the internal electrodes 18a, 18b are buried by terminating them short of the free surface. Again, this leads to a region of the ceramic that remains unpoled (i.e. a region immediately below the free surface, typically having a width of a few hundred microns), resulting in ferroelectric strain discontinuities between poled and unpoled regions.

One known way of preventing surface flashover whilst avoiding the use of buried internal electrodes is to apply some form of passivation to the surface of the sample, such as a polymer encapsulation with relatively high dielectric strength. This provides a partial solution, but an unpoled region of the ceramic remains behind the external electrodes 20a, 20b to isolate the two sets of internal electrodes 18a and 18b. The outermost ones of the piezoelectric layers 40a, 40b that define the end faces of the multilayer structure 14 do not lie between two internal electrodes, and so are not exposed to the coercive field during poling. The outermost piezoelectric layers 40a, 40b therefore remain unpoled.

It is known to apply a poling voltage to a multilayer ferroelectric block in order to induce bulk piezoelectricity in the block. Following poling, the block is then divided or cut into individual samples. For example, U.S. Pat. No. 6,356,008 describes a method of producing a resonator device having a piezoelectric body in which a two stage poling method is applied to a ferroelectric block to induce piezoelectricity. Electrodes are then removed from the block and the block is cut to size to produce the final resonator device.

BRIEF SUMMARY OF THE INVENTION

According to the present invention, there is provided a method of producing an actuator for an injection arrangement, the method comprising:

providing a block of ferroelectric material, cutting and/or shaping the block to a final size to provide a ferroelectric sample which forms an active element of the actuator, in use, the ferroelectric sample having first and second opposing end faces, first and second opposing side faces, and a stack of ferroelectric layers, wherein adjacent layers are separated from one another by one of a plurality of internal electrodes arranged substantially parallel to the end faces of the sample, subsequent to the cutting and/or shaping step, applying a primary external electrode arrangement to the first and second end faces of the sample, applying a primary poling voltage to the primary external electrode arrangement so as to polarize substantially the entire ferroelectric sample along a single, first polarization axis in a first polarization direction, applying a permanent secondary external electrode arrangement to the side faces of the sample so that the secondary electrode arrangement makes contact with the internal electrodes, applying a secondary poling voltage to the secondary electrode arrangement so as to polarize alternate ones of the ferroelectric layers along substantially the first polarization axis in the first polarization direction and the others of the ferroelectric layers are polarized along a second, oppositely directed polarization axis, such that substantially the entire sample is polarized whilst substantially avoiding discontinuities in ferroelectric strain throughout the entire sample.

The method of the invention is advantageous in that it avoids ferroelectric strain discontinuities in the region of the sample adjacent to the secondary electrodes on the side faces. Using conventional poling techniques, this region of the sample remains unpoled and the resulting ferroelectric strain discontinuity between this and the inner, poled region of the sample can cause the unpoled region to fracture. The use of a multilayer structure also permits reduced poling voltages to be used.

In a preferred embodiment, the step of applying the primary poling voltage is applied prior to the step of applying the secondary poling voltage.

Preferably, the method includes providing a ferroelectric sample in which the internal electrodes are grouped into first and second interdigitated sets of electrodes, each set comprising a plurality of internal electrodes.

Preferably, the method includes applying a secondary poling voltage to the secondary electrode arrangement so as to polarize alternate ones of the ferroelectric layers within those regions of the sample located between internal electrodes of different ones of the sets, whereby said alternate ones of the ferroelectric layers are polarized along substantially the first polarization axis in the first polarization direction and the others of the ferroelectric layers are polarized along a second, oppositely directed polarization axis.

In a further preferred embodiment, the method includes providing a secondary external electrode arrangement having a first external electrode applied to one of the side faces and a second external electrode applied to the opposing side face, and wherein the internal electrodes of the first set terminate within the sample at first termination ends which define, together with a first electrode of the secondary external electrode arrangement, a first edge region of the sample, and wherein the internal electrodes of the second set terminate within the sample at second termination ends which define, together with a second electrode of the secondary external electrode arrangement, a second edge region of the sample.

The poling method of the present invention provides the advantage that the first and second edge regions of the sample are poled during the primary poling stage, whereas using conventional techniques these regions remain unpoled and give rise to a ferroelectric strain discontinuity within the sample.

Preferably, the method includes removing the primary external electrode arrangement from the sample prior to applying the secondary external electrode arrangement.

In one embodiment, the method includes applying a conductive film to the first and second end faces to provide first and second primary external electrodes of the primary external electrode arrangement. Alternatively, the method may include inserting the sample between a pre-mounted primary external electrode arrangement, so that first and second primary electrodes contact the first and second end faces of the sample respectively. This is advantageous as the primary external electrode arrangement can be re-used for other ferroelectric samples.

In a preferred embodiment, the sample and the primary electrode arrangement may be immersed within a dielectric fluid for the duration of the application of the primary poling voltage to the primary external electrode arrangement, thereby preventing breakdown which may otherwise occur in air.

Preferably, removal of the dielectric fluid from the surfaces of the sample and/or from the primary external electrode arrangement is achieved through evaporation, and this may aided by applying a heating effect to the sample. It is important that any such applied heating must not cause the temperature of the ferroelectric material to approach its Curie temperature.

By way of example, the method may be used to pole a ferroelectric multilayer sample of the type suitable for incorporation within a piezoelectric actuator for a fuel injector, but it will be appreciated that the poling method may equally be applied with advantage to any ferroelectric multilayer sample.

By way of further example, the primary voltage is typically no greater than 4 kV and the secondary voltage is typically no greater than 200V.

BRIEF DESCRIPTION OF THE SEVERAL VIEWS OF THE DRAWINGS

The invention will now be described, by way of example only, with reference to the accompanying drawings in which.

DETAILED DESCRIPTION OF THE INVENTION

Figure 1:
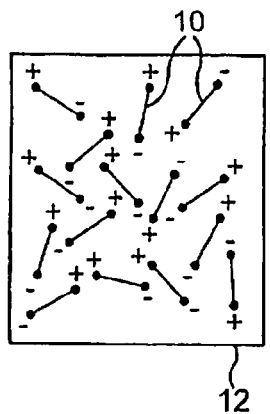
FIG. 1 illustrates electric dipole moments in a ferroelectric ceramic (a) before poling (b) during poling and (c) after poling.
Figure 1:
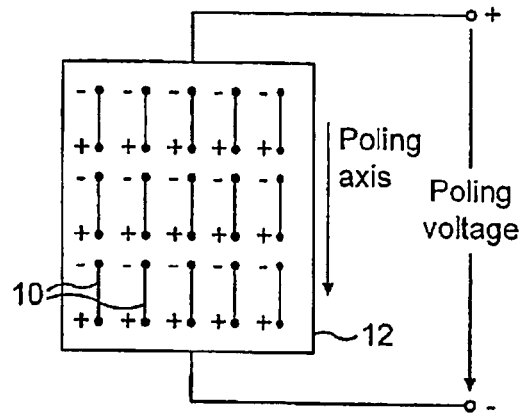
Figure 1:
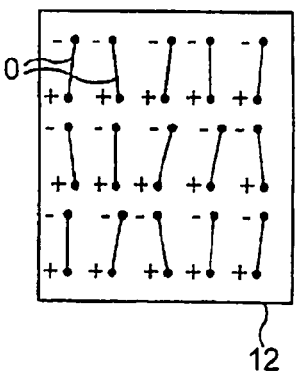
Figure 2:
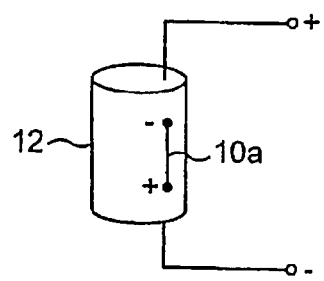
FIG. 2 illustrates piezoelectric strain after poling for an applied electric field (a) having the same polarity as the poling field and (b) having the opposite polarity to the poling field.
Figure 2:
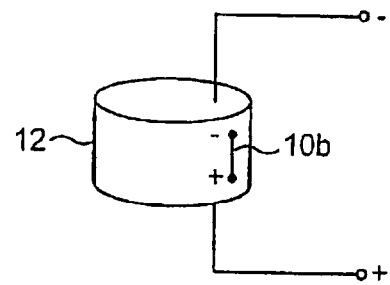
Figure 3:
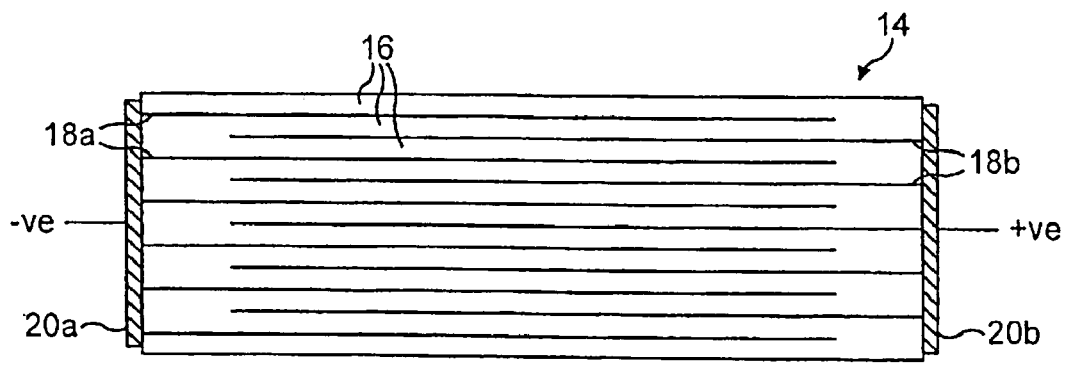
FIG. 3 illustrates a known multilayer ferroelectric structure having a plurality of layers and two sets of interdigitated electrodes.
Figure 4:
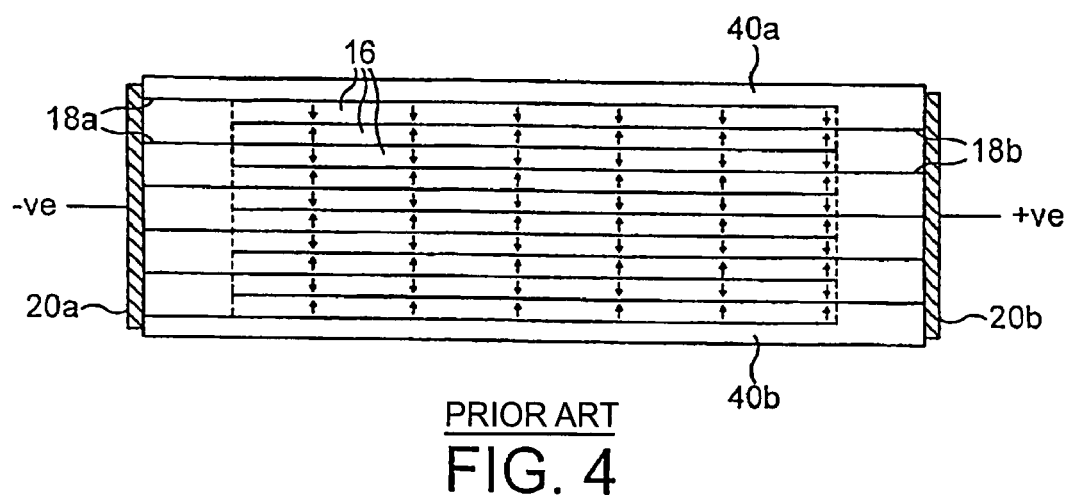
FIG. 4 illustrates the multilayer structure in FIG. 3 and how, using a known method of poling, the poling direction alternates through the structure with the alternating internal electrode polarity.
Figure 5:
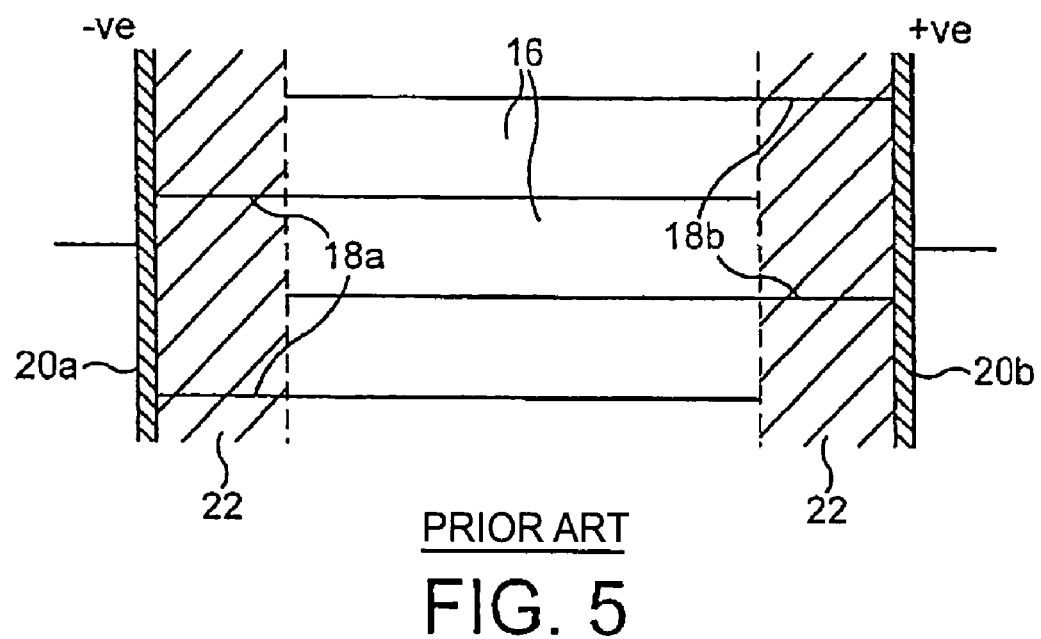
FIG. 5 is an enlarged view of a part of the multilayer structure in FIGS. 3 and 4 after poling using a known technique.
Figure 6:
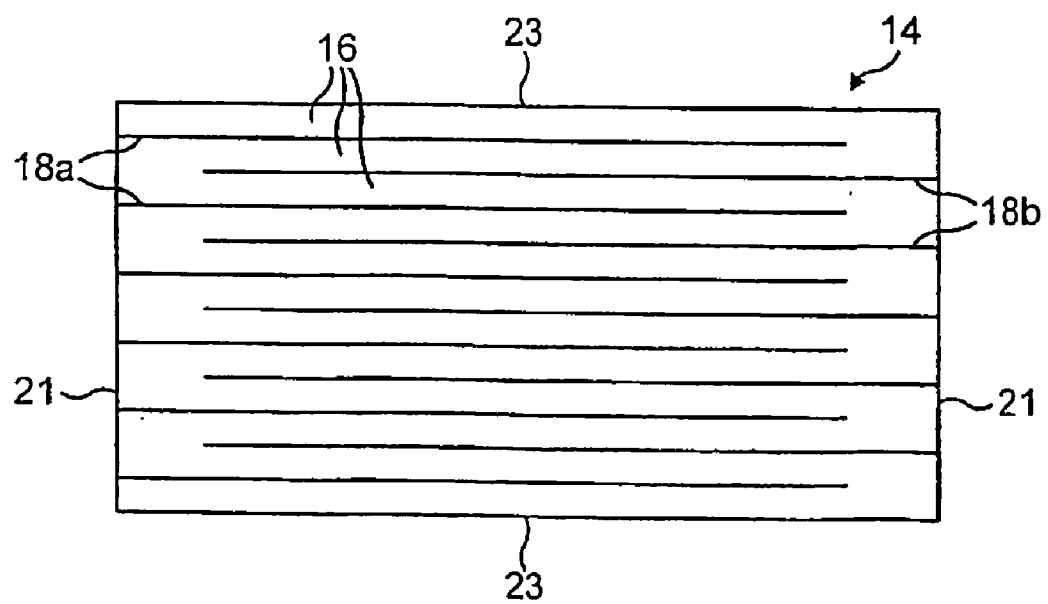
FIG. 6 illustrates a multilayer piezoelectric structure, prior to poling with the method of the present invention.

It has been recognized that if substantially all of the material of a piezoelectric multilayer sample could be poled, there would be no ferroelectric strain discontinuity, and so the detrimental effects of fracture damage and clamping of poled/unpoled regions would be avoided. Referring to FIG. 6, the multilayer composite structure 14 is formed from a stack of layers 16 formed from a ferroelectric material exhibiting piezoelectricity, adjacent ones of the layers 16 being spaced apart by alternate electrodes of the internal electrode sets 18a, 18b, as described previously. The internal electrodes 18a, 18b are arranged to be substantially parallel to front and rear end faces 23 of the sample 14 and extend to a different one of first and second opposing side faces 21 of the sample 14. The multilayer sample 14 is sintered and machined to its final dimensions using conventional techniques.

Figure 7:
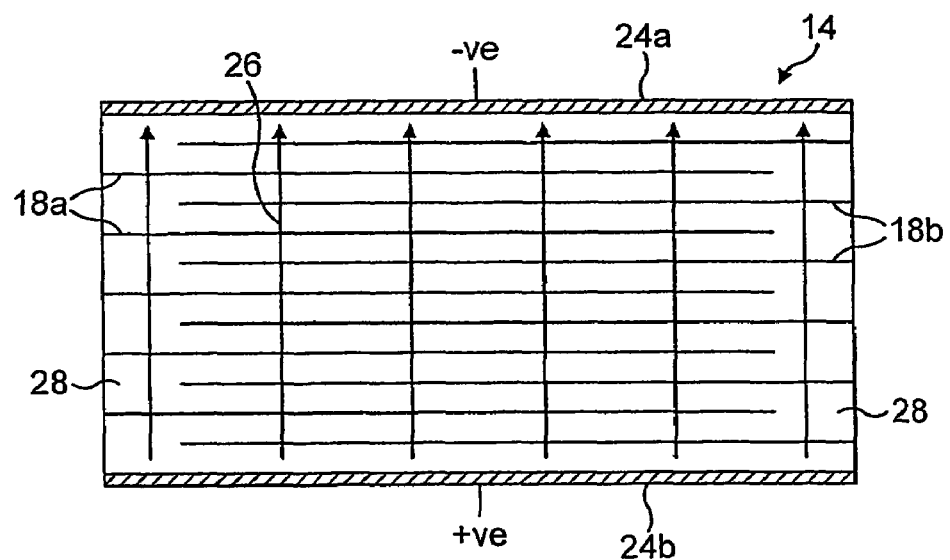
FIG. 7 illustrates an initial step in the poling method of the present invention.

Referring to FIG. 7, first and second temporary primary external electrodes 24a, 24b are attached to the front and rear faces 23 respectively of the sample 14, the primary electrodes 24a, 24b being arranged substantially in parallel with the internal electrodes 18a, 18b. The primary external electrodes 24a, 24b may be provided by applying a conductive paint to the exposed end faces of the sample 14.

In the primary poling stage, a primary poling voltage is applied across the primary external electrodes 24a, 24b to pole the entire multilayer sample 14 along a single polarization axis 26 in a first polarization direction, including regions 28 of ferroelectric material which do not lie between internal electrodes 18a, 18b of opposite polarity. For example, if the multilayer sample 14 has a thickness of approximately 2 mm, and the required poling field is approximately 2 kV/mm, a voltage of 4 kV must be applied to the primary electrodes 24a, 24b during the primary poling stage. In order to prevent breakdown in air during the primary poling stage, the sample 14, including the external electrodes 24a, 24b, may be submerged in a dielectric fluid. Preferably, the dielectric fluid has a relatively low to moderate boiling point so that, following the primary poling stage, fluid traces upon the outer surface of the structure 14 are removed by evaporation. If required, a heating effect may be applied to the sample 14 to encourage evaporation of the dielectric fluid, although any such applied heating must not cause the temperature of the sample 14 to approach the Curie temperature. Finally, as a final step in the primary poling stage, the temporary electrodes 24a, 24b applied to the end faces of the structure 14 are removed.

As an alternative to providing a temporary conductive film to provide the primary external electrodes 24a, 24b, and perhaps more conveniently, the entire structure 14 may be mounted between pre-arranged, reusable electrodes (not shown). In this case the final step of the primary poling stage involves dismounting the sample 14 from the electrode mount.

Figure 8:
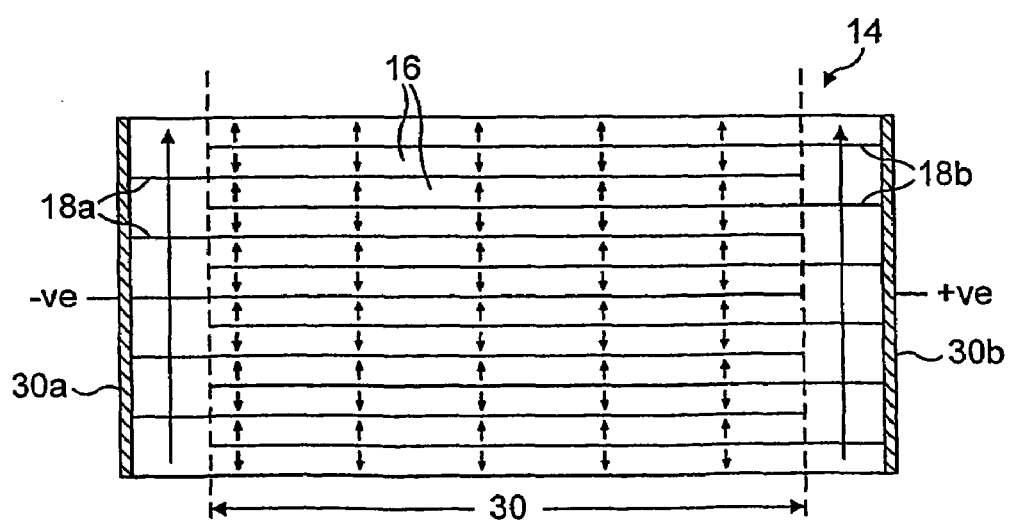
FIG. 8 illustrates a further step in the poling method of the present invention.

The secondary stage of the poling method affects just those regions of ferroelectric material lying between the internal electrodes of opposite polarity (i.e. region 30 between dashed lines, as shown in FIG. 8). As an initial step, permanent secondary external electrodes 30a, 30b are applied to the side faces of the multilayer structure 14, the secondary external electrodes 30a, 30b therefore being arranged substantially perpendicular to the internal electrode sets 18a, 18b.

If a poled ferroelectric ceramic is taken above its Curie temperature it becomes depoled and no longer exhibits bulk piezoelectricity. It is therefore important that the contactation procedure, whereby the conductive paths are completed between the electrodes 30a, 30b and the internal electrodes 18a, 18b, is carried at a temperature below the Curie temperature of the piezoelectric ceramic. To avoid a temperature excursion above the Curie temperature, the secondary external electrodes 30a, 30b may, for example, be formed by a low temperature physical vapor deposition. Alternatively, some form of conductive glaze or metal loaded polymer could be used to form the two common conductive paths.

As shown in FIG. 8, when the secondary external electrodes 30a, 30b are in place, a secondary poling voltage is applied across them to reverse the polarization direction in alternate ones of the ferroelectric layers 16, thereby creating the alternating polarization direction necessary for the multilayer to produce net displacement during actuation. In the secondary poling stage, the poling voltage is much lower as the poling field is applied locally to the layers 16. For example, if each ferroelectric layer 16 has a thickness of approximately 100 microns and requires a poling field of approximately 2 kV/mm, the applied secondary poling voltage must be 200 V.

The degree of ferroelectric strain generated during poling is not dependent upon the poling direction, only the axis of polarization. Hence, as the axis of polarization remains unchanged during the secondary poling stage, the reversal of the polarization direction within the alternating layers 16 does not create a strain discontinuity.

It should be noted that although ferroelectric material lying outside of region 30 (i.e. regions of material which do not lie between opposite polarity internal electrodes 18a, 18b) will be poled during the primary poling stage in the aforementioned technique, the material will not exhibit piezoelectric strain when the internal electrodes are charged as it lies outside the region of the poling field during the secondary poling stage. Thus, although ferroelectric strain discontinuity is avoided, piezoelectric strain discontinuity does still occur. Nevertheless, the method provides the advantage that a primary cause of cracking within the multilayer structure is avoided. In any case, piezoelectric strain is only a temporary effect and is usually less in magnitude than permanent ferroelectric strain.

It will be appreciated that in the two-stage poling method according to the present invention, the primary poling voltage that is applied across the primary external electrodes 24a, 24b and the secondary poling voltage that is applied to the secondary external electrodes 30a, 30b, thus to the internal electrode sets 18a, and 18b, are both applied to an individual multilayer ferroelectric sample that has been manufactured from a monolithic block to a size suitable for a particular application prior to the two-stage poling method taking place. Therefore, the method of this invention has the prior step of cutting and/or shaping the multilayer ferroelectric monolithic block into individual samples suitable for a particular application in, for example, piezoelectric actuators.

The method is particularly suitable for use in poling ferroelectric materials of the type suitable for use in piezoelectric actuators used in fuel injectors. Typically, for example, the ferroelectric material may be lead zirconate titanate, but the two stage poling method may be used to avoid ferroelectric strain discontinuity in any ferroelectric ceramic.

The invention claimed is:

1. A method of producing an actuator for use in an injection arrangement, the method comprising:
    providing a block of ferroelectric material;
    cutting and/or shaping the block to a final size to provide a ferroelectric sample that forms an active element of the actuator, the ferroelectric sample having first and second opposing end faces, first and second opposing side faces, and a stack of ferroelectric layers, wherein adjacent layers of said stack are separated from one another by internal electrodes arranged substantially parallel to the end faces of the sample;
    subsequent to the cutting and/or shaping step, applying a primary external electrode arrangement to the first and second end faces of the sample;
    immersing the sample and the primary electrode arrangement within a dielectric fluid;
    applying a primary poling voltage to the primary external electrode arrangement so as to polarize substantially the entire ferroelectric sample along a single, first polarization axis in a first polarization direction;
    applying a permanent secondary external electrode arrangement to the side faces of the sample so that the secondary external electrode arrangement makes contact with the internal electrodes; and
    applying a secondary poling voltage to the secondary external electrode arrangement so as to polarize alternate ones of the ferroelectric layers along substantially the first polarization axis in the first polarization direction and the others of the ferroelectric layers are polarized along a second, oppositely directed polarization axis, thereby to polarize substantially the entire sample and avoiding discontinuities in ferroelectric strain throughout the sample.

2. The method as claimed in claim 1, wherein the step of applying the primary poling voltage is applied prior to the step of applying the secondary poling voltage.

3. The method as claimed in claim 1 or claim 2, wherein said internal electrodes are grouped into first and second interdigitated sets of electrodes, each set comprising a plurality of internal electrodes.

4. The method as claimed in any of claims 1 to 2, further comprising a step of removing the primary external electrode arrangement from the sample prior to applying the secondary external electrode arrangement.

5. The method as claimed in any of claims 1 to 2, further comprising a step of inserting the sample between a pre-mounted primary external electrode arrangement so that first and second primary electrodes contact the first and second end faces of the sample respectively.

6. The method as claimed in any of claims 1 to 2, further comprising a step of applying a conductive film to the first and second end faces to provide first and second primary external electrodes of the primary external electrode arrangement.

7. The method as claimed in any of claims 1 to 2, wherein said step of immersing is performed during the application of the primary poling voltage.

8. The method as claimed in claim 1, further comprising a step of applying a heating effect to the sample following application of the primary poling voltage to aid evaporation of the dielectric fluid from surfaces of the sample and/or the electrodes.

9. The method as claimed in any of claims 1 to 2, wherein the primary voltage is no greater than 4 kV.

10. The method as claimed in any of claims 1 to 2, wherein the secondary voltage is no greater than 200V.

11. The method as claimed in any of claims 1 to 2, wherein said step of applying a primary poling voltage is performed while the sample and the primary electrode arrangement are immersed within a dielectric fluid.

* * * * *